(12) United States Patent
Hong et al.

(10) Patent No.: US 11,022,662 B2
(45) Date of Patent: Jun. 1, 2021

(54) THREE-AXIS MAGNETIC SENSOR HAVING PERPENDICULAR MAGNETIC ANISOTROPY AND IN-PLANE MAGNETIC ANISOTROPY

(71) Applicant: Industry-University Cooperation Foundation Hanyang University, Seoul (KR)

(72) Inventors: Jin Pyo Hong, Seoul (KR); Seung Mo Yang, Seoul (KR); Hae Soo Park, Seoul (KR)

(73) Assignee: Industry-University Cooperation Foundation Hanyang University, Seoul (KR)

(*) Notice: Subject to any disclaimer, the term of this patent is extended or adjusted under 35 U.S.C. 154(b) by 221 days.

(21) Appl. No.: 16/322,399

(22) PCT Filed: Jul. 28, 2017

(86) PCT No.: PCT/KR2017/008153
§ 371 (c)(1),
(2) Date: Apr. 11, 2019

(87) PCT Pub. No.: WO2018/012953
PCT Pub. Date: Jan. 18, 2018

(65) Prior Publication Data
US 2019/0227130 A1    Jul. 25, 2019

(30) Foreign Application Priority Data
Jul. 12, 2016   (KR) .................. 10-2016-0088108

(51) Int. Cl.
*G01R 33/09*   (2006.01)
*G01R 33/02*   (2006.01)
*G01R 33/00*   (2006.01)

(52) U.S. Cl.
CPC .......... *G01R 33/098* (2013.01); *G01R 33/00* (2013.01); *G01R 33/02* (2013.01); *G01R 33/09* (2013.01); *G01R 33/096* (2013.01)

(58) Field of Classification Search
CPC ........ H01L 43/12; H01L 43/08; H01L 43/10; H01L 43/02; H01L 43/04; H01L 27/22;
(Continued)

(56) References Cited

U.S. PATENT DOCUMENTS

| 2005/0122100 A1 | 6/2005 | Wan et al. |
| 2006/0092698 A1* | 5/2006 | Jeong ............... G11C 11/15 365/173 |

(Continued)

FOREIGN PATENT DOCUMENTS

| CN | 105280214 A | 1/2016 |
| JP | 2006-351684 A | 12/2006 |

(Continued)

OTHER PUBLICATIONS

Written Opinion of the International Searching Authority of PCT/KR2017/008153 dated Nov. 1, 2017.
(Continued)

*Primary Examiner* — Vinh P Nguyen
(74) *Attorney, Agent, or Firm* — Sughrue Mion, PLLC

(57) ABSTRACT

A three-axis magnetic sensor which is not physically separated from each other and made of one element is provided. A spin-orbit torque is generated through an interface junction between a magnetization seed layer and a magnetization free layer, and through this, a change in an in-plane magnetic field may be sensed in the form of current or voltage in the magnetization seed layer. Further, a tunneling insulating layer and a magnetization pinned layer are formed on the magnetization free layer. The formed structure induces a
(Continued)

tunnel magneto-resistance phenomenon. Through this, a change in a magnetic field in a vertical direction is sensed.

12 Claims, 3 Drawing Sheets

(58) Field of Classification Search
CPC ....... H01L 27/2481; H01L 2924/16152; H01L 29/82; H01L 29/40111; H01L 21/8247; H01L 27/222; G11C 5/02; G11C 5/04; G01C 11/15; G01R 33/06; G01R 33/093; G01R 33/098; G01R 33/14
See application file for complete search history.

(56) References Cited

U.S. PATENT DOCUMENTS

| | | | |
|---|---|---|---|
| 2009/0296462 A1* | 12/2009 | Kent | G11C 11/161 365/171 |
| 2012/0012956 A1 | 1/2012 | Saitoh et al. | |
| 2012/0081111 A1 | 4/2012 | Kim et al. | |
| 2013/0116943 A1 | 5/2013 | Pant et al. | |
| 2014/0021426 A1 | 1/2014 | Lee et al. | |
| 2014/0247042 A1* | 9/2014 | Lei | G01R 33/093 324/247 |

FOREIGN PATENT DOCUMENTS

| | | | |
|---|---|---|---|
| JP | 2007-525676 | A | 9/2007 |
| KR | 2000-0026888 | A | 5/2000 |
| KR | 10-2010-0104396 | A | 9/2010 |
| KR | 10-2012-0030155 | A | 3/2012 |
| KR | 10-2014-0011138 | A | 1/2014 |
| KR | 10-2014-0055781 | A | 5/2014 |
| KR | 10-2014-0120451 | A | 10/2014 |
| KR | 2014-0120451 | * | 10/2014 |
| WO | 2015/033464 | A1 | 3/2015 |
| WO | 2015/083601 | A1 | 6/2015 |

OTHER PUBLICATIONS

International Preliminary Report on Patentability of PCT/KR2017/008153 dated Jan. 19, 2019.
International Search Report of PCT/KR2017/008153 dated Nov. 1, 2017.

* cited by examiner

[FIG. 1]
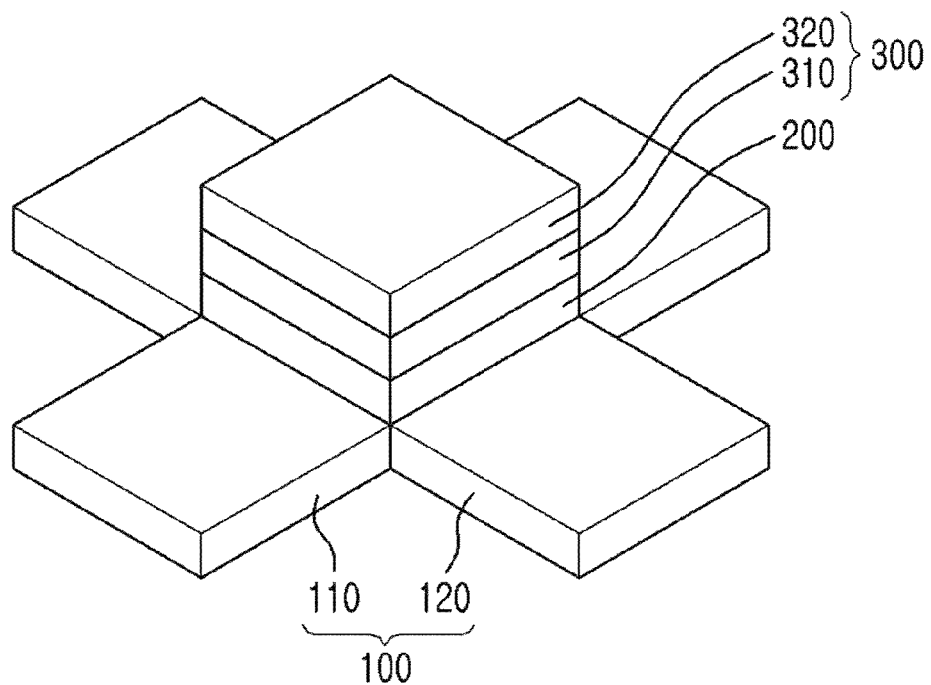
[FIG. 2]
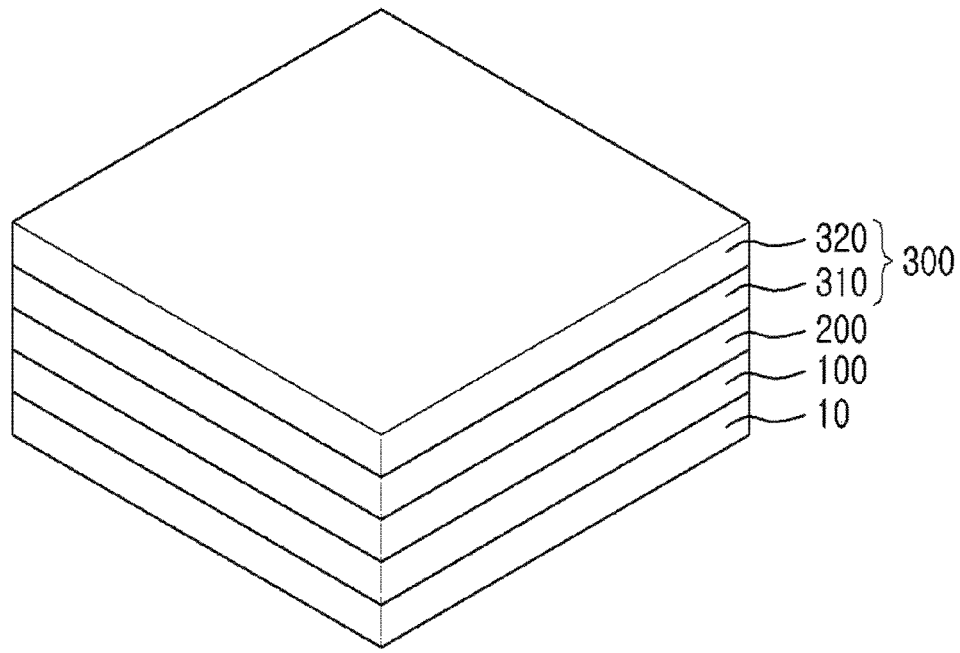

[FIG. 3]
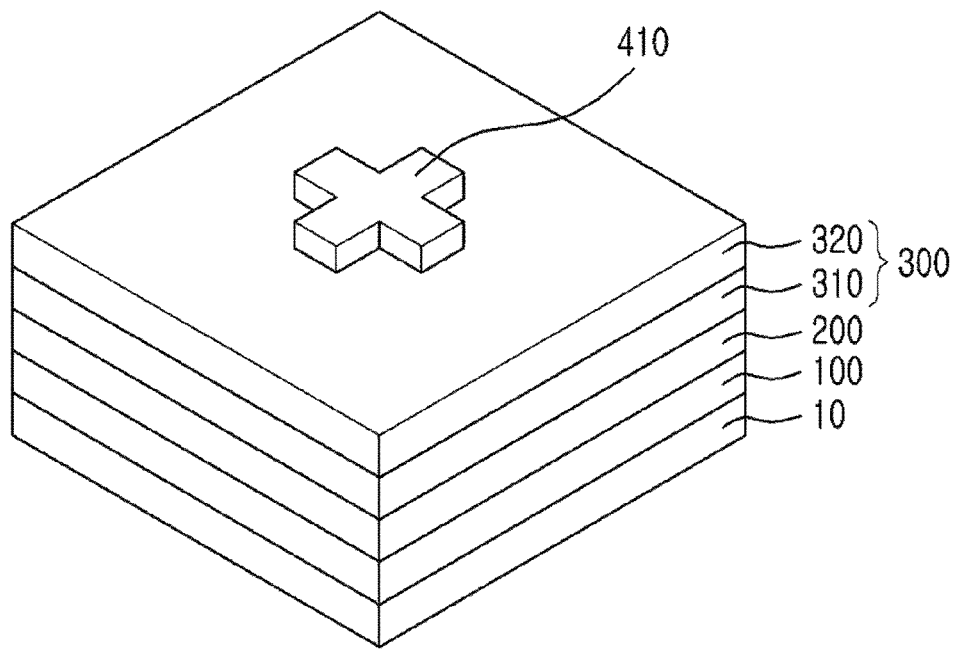
[FIG. 4]
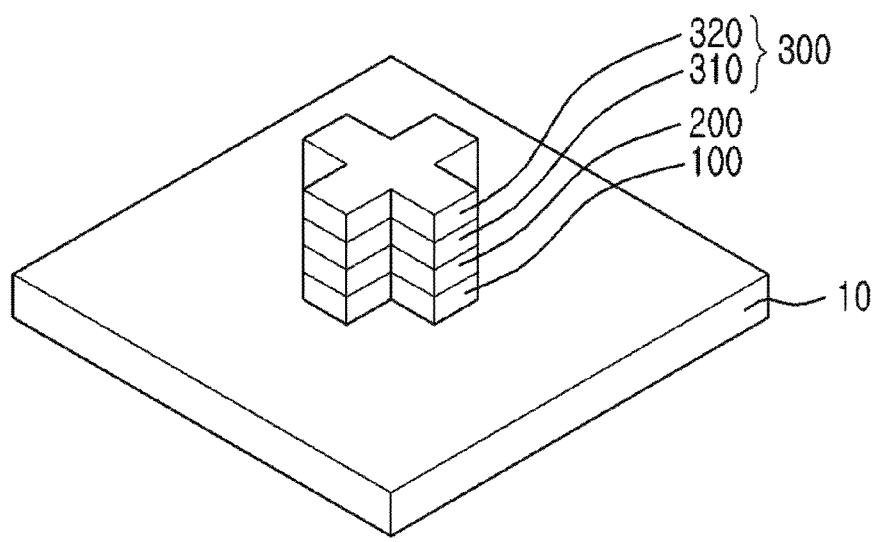

[FIG. 5]
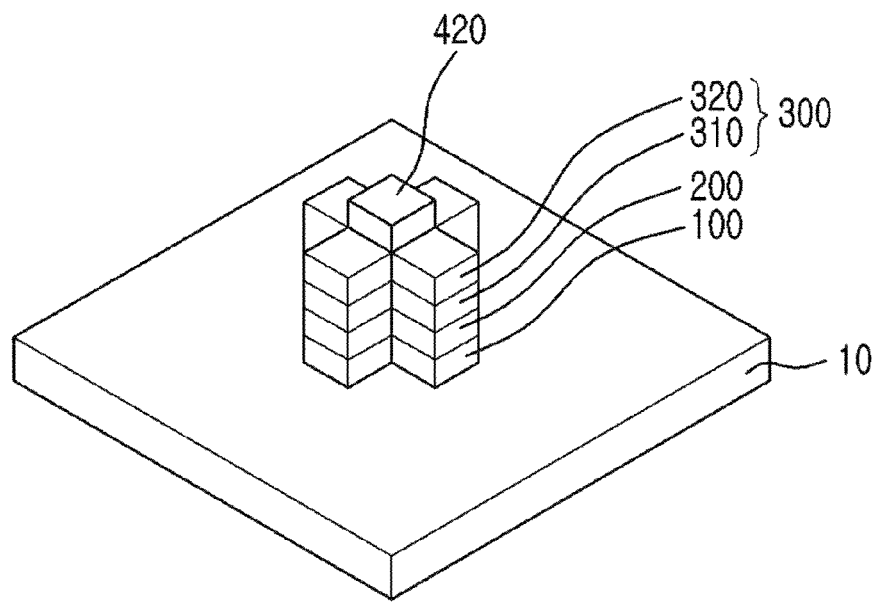
[FIG. 6]
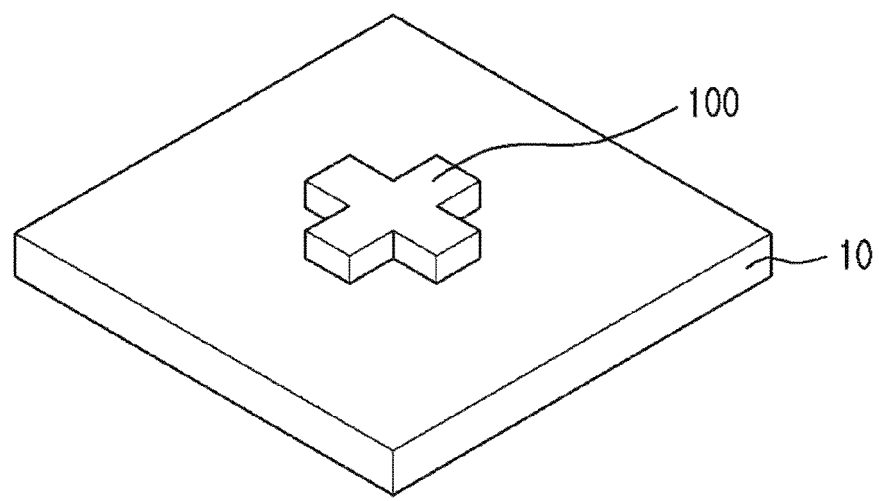

THREE-AXIS MAGNETIC SENSOR HAVING PERPENDICULAR MAGNETIC ANISOTROPY AND IN-PLANE MAGNETIC ANISOTROPY

TECHNICAL FIELD

The present invention relates to a magnetic sensor, and more particularly, to a three-axis magnetic sensor detecting both perpendicular z-axis magnetic anisotropy and in-plane x-y magnetic anisotropy by spin-orbit and spin-torque phenomena in a single chip configuration.

BACKGROUND ART

Magnetic sensors are devices that sense a change in an applied magnetic field and convert the magnetic field into an electrical signal.

Hall sensors are magnetic sensors which are commercially available and widely used. The Hall sensors are devices configured to convert a change in a magnetic field passing through a cross-shaped semiconductor layer into a voltage difference and have recently been used for anti-shake functions of cameras for smartphones.

In addition to the Hall sensors, there are magneto-resistance sensors that utilize magneto-resistance. The magneto-resistance sensors utilize a magneto-resistance effect which is a phenomenon in which electric resistance of a material constituting the magneto-resistance sensor varies depending on the presence or absence of a magnetic field. The magneto-resistance sensors use anisotropic magneto-resistance (AMR), giant magneto-resistance (GMR), or tunneling magneto-resistance (TMR). The magneto-resistance sensors have at least ten times sensitivity compared to the existing Hall sensors, regardless of the principle of operation.

An anisotropic magneto-resistance phenomenon is an effect that occurs in ferromagnetic metals and their alloys and is known as an additional effect in addition to a normal magneto-resistance effect. This is caused by spin-orbit interaction, and known to occur depending on a magnetization easy axis of ferromagnetic materials and an angle between an external magnetic field and a current and to have a relatively low sensitivity.

A giant magneto-resistance phenomenon is a phenomenon in which electric resistance is greatly different between a case where magnetic directions of two magnetic layers are parallel to each other and a case where the magnetic directions of two magnetic layers are antiparallel to each other. Which is realized through a multilayer structure that is a structure in which a conductor film is formed between two magnetic thin films. A layer in which a magnetization direction is fixed is provided among the two magnetic thin films, and maximum resistance appears when magnetization directions of the magnetic thin films are opposite to each other.

A tunnel magneto-resistance phenomenon is a spin tunneling method and has an advantage of high reproducing sensitivity. Which is achieved by forming a nonmagnetic layer as an electrically insulating layer and utilizes a phenomenon in which a tunneling effect of the electrically insulating layer varies according to a magnetic angle of a magnetization pinned layer and a magnetization free layer.

Japanese Patent No. 5765721 discloses a magnetic sensor using a tunnel magneto-resistance. In the above-described patent, TaN is used for a seed layer, CoFeB is used for a magnetic layer, MgO is used for an oxide layer which is an electrically insulating layer, and TaN is used for a capping layer. Which is characterized in that the magnetic layers are composed of a fixed-end and a free-end and use perpendicular magnetic anisotropy.

Further, in Japanese Patent Application Publication No. 2010-266247, MgO is used for a tunnel insulating layer, CoFe is used for a magnetization pinned layer, and CoFe is used for a magnetization free layer. However, in the above-described patent, an antiferromagnetic layer or the like is used, and an AC current is applied to a sensor to improve sensing sensitivity.

The patents described above have a z-axis sensing structure. That is, a mechanism of sensing a change in resistance in a direction parallel to a magnetic field is used when the magnetic field in a direction perpendicular to a plane where the magnetic layer is formed is applied to the plane. To realize a sensing structure including an x-axis or y-axis, a method of sensing by providing each magnetic sensor in plural may be proposed. However, which requires a plurality of sensors to be provided, and it is burdensome to have a plurality of additional circuits for driving the sensors or sensing operating states of the sensors.

DISCLOSURE

Technical Problem

The present invention is directed to providing a magnetic sensor capable of performing a three-axis sensing operation utilizing a single configuration.

Technical Solution

One aspect of the present invention provides a three-axis magnetic sensor including a magnetization seed layer configured to sense a change in a magnetic field in a horizontal direction, a magnetization free layer formed on the magnetization seed layer and made of a ferromagnetic material, and a vertical sensing part formed on the magnetization free layer and configured to sense a change in a magnetic field in a vertical direction.

Another aspect of the present invention provides a three-axis magnetic sensor including a magnetization seed layer, a magnetization free layer, and a vertical sensing part, wherein, the magnetization seed layer shares the magnetization free layer with the vertical sensing part, the magnetization seed layer and the magnetization free layer sense a change in a magnetic field in a horizontal direction, and the vertical sensing part and the magnetization free layer sense a change in a magnetic field in a vertical direction.

Advantageous Effects

According to the present invention described above, a magnetic sensing operation using both a spin-orbit torque phenomenon and a tunnel magneto-resistance effect can be performed in one magnetic sensor. A change in a magnetic field applied in dual x-y horizontal directions can be sensed by the spin-orbit torque, and a change in a magnetic field applied in a vertical direction can also be sensed by the tunnel magneto-resistance effect created by spin-torque phenomena. Accordingly, a high sensitivity can be maintained at a low manufacturing cost as compared with the related art in which each magnetic sensor is provided in plural for a three-axis sensing operation.

DESCRIPTION OF DRAWINGS

FIG. 1 is a perspective view illustrating a three-axis magneticsensor according to an exemplary embodiment of the present invention.

FIGS. 2 to 5 are perspective views illustrating a method of manufacturing the three-axis magnetic sensor of FIG. 1 according to an exemplary embodiment of the present invention.

FIG. 6 is another perspective view illustrating the method of manufacturing the three-axis magnetic sensor of FIG. 1 according to an exemplary embodiment of the present invention.

MODES OF THE INVENTION

While the present invention is susceptible to various modifications and alternative forms, specific embodiments thereof are shown by way of example in the drawings and will herein be described in detail. However, the description is not intended to limit the present disclosure to the specific exemplary embodiments, and it is to be understood that all the changes, equivalents, and substitutions belonging to the spirit and technical scope of the present disclosure are included in the present disclosure. In the description of the drawings, similar reference numerals may be used for similar components.

Unless otherwise defined, all terms used herein including technical or scientific terms have the same meanings as those generally understood by one of ordinary skill in the art. It should be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, preferred embodiments of the present disclosure will be described more fully with reference to the accompanying drawings.

EMBODIMENTS

FIG. 1 is a perspective view illustrating a three-axis magnetic sensor according to an exemplary embodiment of the present invention.

Referring to FIG. 1, a magnetization seed layer 100, a magnetization free layer 200, and a vertical sensing part 300 are provided.

The magnetization seed layer 100 has an approximately cross-shaped structure, and magnetization thereof is changed by a magnetization reversal mechanism through a spin-orbit torque (SOT), and thus magneto-resistance of the magnetization seed layer 100 is changed. The change in the magneto-resistance of the magnetization seed layer 100 is achieved through an interface junction with the magnetization free layer 200. That is, a change in a magnetic field applied in a horizontal direction, may be sensed by the change in the magneto-resistance of the magnetization seed layer 100 in the presence of current flowing through the magnetization free layer 200 and the magnetization seed layer 100 in a z-axis direction or voltage applied thereto.

The magneto-resistance of the magnetization seed layer 100 is changed due to the spin-orbit torque. For the magnetization seed layer 100, Ta, W, Hf, Mo, Nb, Ti, Pt, or Pd which is a nonmagnetic material may be selected, and alloys thereof may also be selected.

Regarding magnetization reversal according to the spin-orbit torque, various models have been proposed in academia as of the filing date. Among them, two models of the magnetization reversal mechanisms are mainly introduced.

The first is magnetization reversal by a Rashba effect.

This is an effect raised by Rashba in 1960 and a theory in which when a potential difference is applied to a two-dimensional electromagnetic field formed on a surface or an interface where different materials are bonded to each other in a direction perpendicular to the surface or the interface, a state of electron spin is changed even in a nonmagnetic material, and thus the magnetization reversal may be induced.

The second is magnetization reversal by a spin Hall effect.

This is a charge transport phenomenon predicted by Dyakonov and Perel in 1971 and a phenomenon that occurs when a current flows in a material with strong spin-orbit coupling, and produces a similar electromotive force to a classical Hall effect. A normal spin injection is a phenomenon that occurs when current flows through a ferromagnetic material and a nonmagnetic material, while the spin-orbit coupling is a phenomenon in which spin current may be formed in the nonmagnetic material.

The magnetization reversal phenomenon occurs through the above described two theories. That is, the magnetization reversal occurs in the magnetization seed layer 100 due to the interface junction between the magnetization seed layer 100 and the magnetization free layer 200. The magnetization free layer 200 may have perpendicular magnetic anisotropy and be characterized in that a spin torque may be changed by applying a magnetic field thereto. CoFeB may be used as a ferromagnetic material for the magnetization free layer 200.

Changes in magnetic fields in an x-axis and a y-axis need to be sensed to sense a change in a magnetic field in a horizontal direction. To this end, the magnetization seed layer 100 is provided with an x-axis sensing part 110 and a y-axis sensing part 120.

The x-axis sensing part 110 is extended in a y-axis direction and senses the change in the magnetic field applied in the x-axis direction. Further, the y-axis sensing part 120 is extended in the x-axis direction to sense the change in the magnetic field applied in the y-axis direction. The magnetization seed layer 100 has an approximately cross shape by combining the x-axis sensing part 110 and the y-axis sensing part 120.

When the magnetic field applied in the x-axis direction is changed, a change in resistance in the x-axis sensing part 110 that is extended in the y-axis direction is generated due to a spin-orbit torque phenomenon, which may be sensed as a change in current or voltage.

Further, when the magnetic field applied in the y-axis direction is changed, a change in resistance in the y-axis sensing part 120 that is extended in the x-axis direction is generated due to a spin-orbit torque phenomenon, which may be sensed as a change in current or voltage.

For example, a current having a first frequency f1 may be supplied in the x-axis direction, and a current having a second frequency f2 may be supplied in the y-axis which is perpendicular to and coplanar with the x-axis. The first frequency f1 and the second frequency f2 may have different values from each other. Further, in the currents each having the frequency, the frequencies may be set to minimize mutual interference.

When the magnetic field changes in the x-axis direction, the voltage in the y-axis direction changes. Through this, the change of the magnetic field may be sensed in the form of the current or voltage. Further, when the magnetic field changes in the y-axis direction, the voltage in the x-axis direction changes.

A thickness of a material constituting the magnetization seed layer 100 may be 3 nm to 10 nm. When the thickness of the magnetization seed layer 100 is less than 3 nm, a Rashba effect due to the interface junction may not be sufficiently obtained, and a thickness control may be substantially difficult. Further, when the thickness of the magnetization seed layer 100 is greater than 10 nm, the current may not be sufficiently supplied through the vertical sensing part 300, which is formed above the magnetization seed layer 100 and has a tunnel magnetoresistive structure, and thus a change of the horizontal magnetic field due to the spin-orbit torque phenomenon may be difficult to be sensed.

The vertical sensing part 300 is provided on the magnetization free layer 200. The magnetization seed layer 100, the magnetization free layer 200, and the vertical sensing part 300 have an integrated structure that is not physically separated from each other.

Further, in order for the magnetization seed layer 100 to sense the change of the horizontal magnetic field, a bias application or a current supply in the vertical sensing part 300 should be performed.

The vertical sensing part 300 has the tunnel magnetoresistive structure. To this end, the vertical sensing part 300 includes a tunneling insulating layer 310 and a magnetization pinned layer 320. MgO may be used for the tunneling insulating layer 310, and CoFeB having in-plane magnetic anisotropy may be used for the magnetization pinned layer 320.

The tunnel magnetoresistive structure is completed by the magnetization free layer 200, the tunneling insulating layer 310, and the magnetization pinned layer 320. Thus, a change in a magnetic field applied to the z-axis may be sensed as a change in current flowing through the vertical sensing part 300 or a change in voltage.

Accordingly, the magnetization free layer 200 is shared to sense the horizontal magnetic field through induction of the spin-orbit torque and sense a magnetic field in a vertical direction through the tunnel magneto-resistance.

The magnetization free layer 200 having perpendicular magnetic anisotropy forms an interface junction with the magnetization seed layer 100 formed thereunder and induces the spin-orbit torque phenomenon to induce a change in magneto-resistance in the magnetization seed layer 100.

Further, the magnetization free layer 200, the tunneling insulating layer 310, and the magnetization pinned layer 320 form a tunnel magnetoresistive structure, and sense a change in the magnetic field in the vertical direction. That is, the magnetization free layer 200 and the magnetization pinned layer 320, which are two ferromagnetic materials, are provided with the tunneling insulating layer 310 therebetween, wherein the two ferromagnetic materials include the magnetization pinned layer 320 having in-plane magnetic anisotropy in which a magnetization direction is not changed even in applied current and the magnetization free layer 200 in which the magnetization direction is changed. Since the direction of the current in the vertical sensing part 300 is in the z-axis, the magnetization pinned layer 320 has the in-plane magnetic anisotropy. Accordingly, spins are aligned in a direction parallel to a plane surface in the magnetization pinned layer 320. Further, the magnetization free layer 200 has perpendicular magnetic anisotropy, so that spins in a direction perpendicular to the plane surface appear.

The amount of current flowing in the z-axis direction is determined by a current path formed by the magnetization free layer 200 and the magnetization pinned layer 320. That is, when the magnetization directions in the magnetization free layer 200 and the magnetization pinned layer 320 are the same, tunneling current flowing through the tunneling insulating layer 310 is maximized, and when the magnetization directions are opposite to each other, the tunneling current flowing through the tunneling insulating layer 310 is minimized. Accordingly, tunneling resistance is changed according to an external magnetic field. In particular, since the magnetization free layer 200 has the perpendicular magnetic anisotropy, tunneling resistance thereof may be changed according to the change in the magnetic field applied in the z-axis.

FIGS. 2 to 5 are perspective views illustrating a method of manufacturing the three-axis magnetic sensor of FIG. 1 according to an exemplary embodiment of the present invention Referring to FIG. 2, the magnetization seed layer 100, the magnetization free layer 200, the tunneling insulating layer 310, and the magnetization pinned layer 320 are sequentially formed on a substrate 10.

The substrate 10 may be freely selected from among materials capable of maintaining thermal stability when a material to be formed thereafter is deposited. For example, $SiO_2$ or the like may be used as the substrate, and there is no particular limitation.

Referring to FIG. 3, a first photoresist pattern 410 is formed on a structure formed in FIG. 2. The first photoresist pattern 410 is formed through a normal photolithography process. The first photoresist pattern 410 to be formed has an approximately cross shape. Through this, the cross-shaped magnetization seed layer 100 may be formed.

Referring to FIG. 4, using the first photoresist pattern 410 of FIG. 3 as an etch mask, etching proceeds until the lower substrate 10 is exposed. Through this, a cross-shaped structure is formed. Subsequently, the remaining photoresist pattern is removed through a plasma ashing process or the like.

Referring to FIG. 5, a second photoresist pattern 420 is formed at a center of the approximately cross-shaped structure. In addition, using the formed second photoresist pattern 420 as an etch mask, etching proceeds until the lower magnetization seed layer 100 is exposed. Through this, the magnetization free layer 200, the tunneling insulating layer 310, and the magnetization pinned layer 320 are sequentially formed above the cross-shaped magnetization seed layer 100, and the manufactured three-axis magnetic sensor is the same as that shown in FIG. 1

Further, in this embodiment, the three-axis magnetic sensor may be formed through another manufacturing method.

For example, deposition using a photoresist pattern and lifting-off may be used for the forming.

FIG. 6 is another perspective view illustrating the method of manufacturing the three-axis magnetic sensor of FIG. 1 according to an exemplary embodiment of the present invention Referring to FIG. 6, a photoresist pattern having an approximately cross-shaped open region is formed on the substrate 10, and the magnetization seed layer 100 for burying the open region in the formed photoresist patterns is formed. Subsequently, the approximately cross-shaped magnetization seed layer 100 may be obtained through lifting-off the photoresist pattern.

Besides, the cross-shaped magnetization seed layer 100 may be obtained by forming the magnetization seed layer on the substrate 10, and forming a cross-shaped photoresist pattern on the magnetization seed layer, and etching the magnetization seed layer using the cross-shaped photoresist pattern as an etch mask.

Subsequently, the photoresist pattern is formed on the cross-shaped magnetization seed layer 100. A central portion of the magnetization seed layer 100 is opened by the formed photoresist pattern. Subsequently, the magnetization free layer 200, the tunneling insulating layer 310, and the magnetization pinned layer 320 are sequentially formed by a normal deposition method. Finally, the three-axis magnetic sensor of FIG. 1 may be obtained through lifting-off the photoresist pattern.

In the present invention described above, the sensing of the horizontal magnetic field is performed through the spin-orbit torque operation, and at the same time, the sensing of the magnetic field in the vertical direction is performed through a tunnel magneto-resistance effect. Through this, sensing of changes in the three-axis magnetic field may be possible.

The invention claimed is:

1. A three-axis magnetic sensor comprising:
a magnetization seed layer configured to sense a change in a magnetic field in a horizontal direction;
a magnetization free layer formed on the magnetization seed layer and made of a ferromagnetic material; and
a vertical sensing part formed on the magnetization free layer and configured to sense a change in a magnetic field in a vertical direction,
wherein the magnetization seed layer has a cross-shaped structure,
wherein the magnetization seed layer includes: an x-axis sensing part extended in a y-axis direction and configured to sense a change in a magnetic field applied in an x-axis direction; and a y-axis sensing part coplanar with the x-axis sensing part, extended in the x-axis direction, and configured to sense a change in a magnetic field applied in the y-axis direction.

2. The three-axis magnetic sensor of claim 1, wherein the magnetization seed layer includes Ta, W, Hf, Mo, Nb, Ti, Pt, or Pd.

3. The three-axis magnetic sensor of claim 1, wherein the magnetization seed layer forms an interface junction with the magnetization free layer, and magneto-resistance thereof is changed by a spin-orbit torque,
wherein the spin-orbit torque generated by a change in a magnetic field horizontally applied to the magnetization seed layer in a presence of current flowing though the magnetization free layer and the magnetization seed layer or voltage applied through the magnetization free layer and the magnetization seed layer.

4. The three-axis magnetic sensor of claim 3, wherein the magnetization free layer has perpendicular magnetic anisotropy.

5. The three-axis magnetic sensor of claim 3, wherein the magnetization seed layer has a thickness in a range of 3 nm to 10 nm.

6. The three-axis magnetic sensor of claim 1, wherein the vertical sensing part includes a tunneling insulating layer formed on the magnetization free layer, and a magnetization pinned layer formed on the tunneling insulating layer and having in-plane magnetic anisotropy.

7. The three-axis magnetic sensor of claim 6, wherein the vertical sensing part senses the magnetic field in the vertical direction by a tunnel magneto-resistance effect together with the magnetization free layer.

8. A three-axis magnetic sensor comprising:
a magnetization seed layer;
a magnetization free layer; and
a vertical sensing part,
wherein, the magnetization seed layer shares the magnetization free layer with the vertical sensing part, the magnetization seed layer and the magnetization free layer sense a change in a magnetic field in a horizontal direction, and the vertical sensing part and the magnetization free layer sense a change in a magnetic field in a vertical direction,
wherein the vertical sensing part includes a tunneling insulating layer formed on the magnetization free layer and a magnetization pinned layer formed on the tunneling insulating layer and having in-plan magnetic anisotropy.

9. The three-axis magnetic sensor of claim 8, wherein a spin-orbit torque is generated by an interface junction between the magnetization free layer and the magnetization seed layer, and magneto-resistance is changed in the magnetization seed layer,
wherein the spin-orbit torque is generated by a change in a magnetic field horizontally applied to the magnetization seed layer in a presence of current flowing through the magnetization free layer and the magnetization seed layer or voltage applied through the magnetization free layer and the magnetization seed layer.

10. The three-axis magnetic sensor of claim 8, wherein the magnetization seed layer includes Ta, W, Hf, Mo, Nb, Ti, Pt, or Pd.

11. The three-axis magnetic sensor of claim 8, wherein the magnetization free layer and the vertical sensing part form a tunnel magneto-resistance structure to sense a change in a magnetic field applied in a vertical direction.

12. The three-axis magnetic sensor of claim 11, wherein the magnetization free layer has perpendicular magnetic anisotropy.

* * * * *